United States Patent
Chiu et al.

(10) Patent No.: US 8,421,185 B2
(45) Date of Patent: Apr. 16, 2013

(54) PARASITIC VERTICAL PNP BIPOLAR TRANSISTOR IN BICMOS PROCESS

(75) Inventors: Tzuyin Chiu, Shanghai (CN); TungYuan Chu, Shanghai (CN); Wensheng Qian, Shanghai (CN); YungChieh Fan, Shanghai (CN); Donghua Liu, Shanghai (CN); Jun Hu, Shanghai (CN)

(73) Assignee: Shanghai Hua Hong NEC Electronics Company, Limited, Shanghai (CN)

( * ) Notice: Subject to any disclaimer, the term of this patent is extended or adjusted under 35 U.S.C. 154(b) by 114 days.

(21) Appl. No.: 12/978,552

(22) Filed: Dec. 25, 2010

(65) Prior Publication Data

US 2011/0156202 A1    Jun. 30, 2011

(30) Foreign Application Priority Data

Dec. 31, 2009 (CN) .......................... 2009 1 0202067

(51) Int. Cl.
*H01L 29/70* (2006.01)
(52) U.S. Cl.
USPC ..... 257/526; 257/342; 257/370; 257/E29.171
(58) Field of Classification Search .................. 257/342, 257/370, 378, 526, E29.171
See application file for complete search history.

(56) References Cited

U.S. PATENT DOCUMENTS

| | | | |
|---|---|---|---|
| 2001/0015470 A1* | 8/2001 | Gregory | 257/511 |
| 2002/0160562 A1* | 10/2002 | Babcock et al. | 438/207 |
| 2006/0105517 A1* | 5/2006 | Johansson et al. | 438/205 |
| 2009/0212363 A1* | 8/2009 | Krivokapic | 257/347 |

* cited by examiner

*Primary Examiner* — Victor A Mandala
*Assistant Examiner* — Whitney T Moore
(74) *Attorney, Agent, or Firm* — Ming Chow; Sinorica, LLC

(57) ABSTRACT

A parasitic vertical PNP device in one type of BiCMOS process with shallow trench isolation (STI) comprises a collector formed by a p type impurity ion implantation layer inside active area, the bottom of collector connects to a p type buried layer, the p type pseudo buried layer is formed in bottom of shallow trench at both sides of collector active region through ion implantation, deep contacts through field oxide to connect pseudo buried layers and to pick up the collector; a base, formed by n type impurity ion implantation layer which sits on top of above stated collector; an emitter, a p type epitaxy layer lies above base and is connected out directly by a metal contact. Part of the p type epitaxy layer is converted into n type, which serves as connection path of base. Present invented PNP can be used as output device of BiCMOS high frequency circuit. It has a small device area and conduction resistance.

2 Claims, 4 Drawing Sheets

US 8,421,185 B2

PARASITIC VERTICAL PNP BIPOLAR TRANSISTOR IN BICMOS PROCESS

The current invention claims a foreign priority to the application of China 200910202067.2 filed on Dec. 31, 2009.

FIELD OF THE INVENTION

This invention relates generally to semiconductor devices in integrated circuits. More particularly it relates to one type of parasitic vertical PNP device in BiCMOS process.

BACKGROUND OF THE INVENTION

In radio frequency (RF) applications, higher and higher cut-off frequency ($F_t$) of RF transistor is required. Silicon bipolar junction transistor (BJT) and especially SiGeC heterojunction bipolar transistor (SiGeC HBT) are the best options of high $F_t$ devices. As SiGe is compatible with silicon process, SiGe HBT has already become one of the mainstream ultra high frequency devices.

In conventional BiCMOS process, parasitic vertical PNP bipolar transistor collector is picked up by sinker in active region to the heavily doped collector buried layer or well under STI. This approach is determined by the nature of such vertical device. The disadvantage of such structure is too big device size and high collector resistance. STI between sinker active to intrinsic collector is necessary for such structure, which further set limit for device size reduction.

SUMMARY OF THE INVENTION

It is therefore an objective of the present invention to offer a parasitic vertical PNP bipolar transistor with smaller device size and less conduct resistance, ready to be used for output device of BiCMOS high frequency circuit.

The objective of the invention is accomplished by providing a shallow trench isolated parasitic vertical PNP transistor, comprises:

a collector, which is formed by implanting p type impurity layer inside active; Collector is picked up by deep contact hole to p type pseudo buried layer at the bottom of collector. The p type buried layer (PBL) is formed by ion implant into STI bottom located at both side of collector; Deep trench contacts are formed by open deep contact holes through STI field oxide on top of corresponding PBL and fill the hole with metal; The ion implant dosage is 1e14~1e16 $cm^{-2}$ and energy below 45 keV for p type buried layer.

a base, formed by ion implanting n type impurity layer which sits on top of above stated collector.

an emitter, a p type epitaxy layer lies above the base and is connected out directly by a metal contact.

Part of the p type epitaxy layer on top of base is converted into n type, serves as connection path of base.

Present invented PNP can be used as output device of BiCMOS high frequency circuit. Deep contacts in field oxide to P type pseudo buried layer are used for collector pick-up. Compared to conventional bipolar transistors this can effectively reduce the device size. Furthermore, due to short distance of pick up to intrinsic collector, parasitic resistance is also reduced, which is very helpful for device high frequency characteristics. Other characteristics, such as current gain, will not be affected.

BRIEF DESCRIPTION OF THE DRAWINGS

A brief description of the invention, as illustrated in the accompanying drawings.

DETAILED DESCRIPTION OF THE INVENTION

Figure 1:
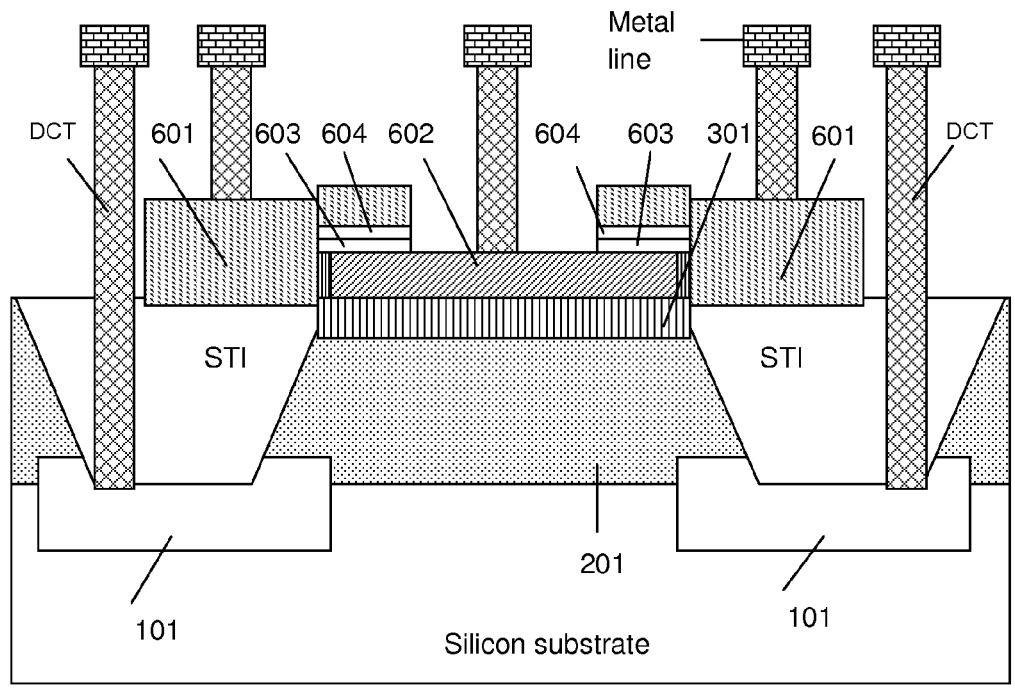
FIG. 1 is cross sectional view showing the structure of parasitic vertical bipolar transistor in BiCMOS process.

The foregoing and the object, features, and advantages of the invention will be apparent from the following detailed description of the invention, as illustrated in the accompanying drawings, in which:

FIG. 1 is cross sectional view showing the structure of parasitic vertical bipolar transistor in BiCMOS process with shallow trench isolation. The device comprises:

A collector 201, consist of implants of p type impurity into active area. This implanted p type impurity can adopt p well of MOSFET, or only adopt anti-punch-through and threshold implants of p well. The bottom of collector 201 connects to p type buried layer 101. P type buried layer 101 is formed at bottom of STI in both sides of collector 201 through ion implant. The ion implant dosage is range 1e14~1e16 $cm^{-2}$ and energy below 45 keV. Collector 201 is picked up by deep contacts formed by open deep contact holes through STI field oxide on top of corresponding PBL. Device collector is formed by connect a metal line to the top of deep contacts.

Base 301 is consisted of an implanted N type impurity layer formed on top of collector 201. NLDD implant of NMOS device is adopted.

An emitter 602 is formed by P type epitaxy layer on top of base 301. The P-type epitaxy layer can be silicon epitaxy layer, or silicon germanium (SiGe) epitaxy layer, or silicon germanium carbon (SiGeC) epitaxy layer. It is the same layer as base of NPN bipolar transistor. It is a single crystal P type epitaxy layer formed on active region. Later it is heavily doped by P type impurity implant. The emitter is picked up directly by a metal contact.

Outside of emitter active region, the substrate is silicon oxide or polysilicon. Polysilicon will grow in these regions during epitaxy. Part of the P type epitaxy layer on top of base 301 will convert into N type and be used as base connection. It finally forms N type polysilicon 601 and is picked up as base by a metal contact. The approach to convert P type epitaxy to N type is: a polysilicon thin film is deposited on P type epitaxy layer, such polysilicon thin film can be in-situ doped, or un-doped. It is then doped by N type MOS source/drain heavy dose implant, later the impurity is uniformly distributed into full polysilicon body by thermal anneal, with the characteristics of impurity rapid diffusion rate inside polysilicon at high temperature. The original P type silicon (or SiGe, SiGeC) epitaxy layer is converted into N type, a connection to N type base region is realized.

Figure 2A:
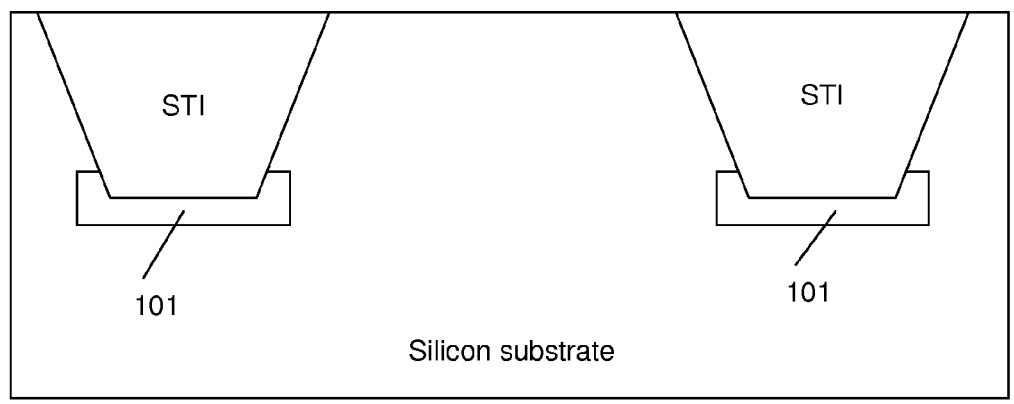
FIG. 2A to 2F show step by step cross sectional view of the structure of parasitic vertical bipolar transistor during manufacturing.

FIG. 2A-2F is illustrations of the cross section diagram of present invented parasitic vertical PNP bipolar transistor during manufacturing process, following steps are comprised:

Process step 1 as in FIG. 2A; lightly doped P type substrate is used, shallow trench is used as isolation. After shallow trench is etched, P type impurity is carried out to form low resistance region, also refer to as pseudo P+ buried layer (PBL) 101, the implant dose is 1e14~1e16 $cm^{-2}$. Pseudo buried layer 101 can realize low resistance connection very effectively in present invented parasitic vertical NPN bipolar transistor.

Figure 2B:
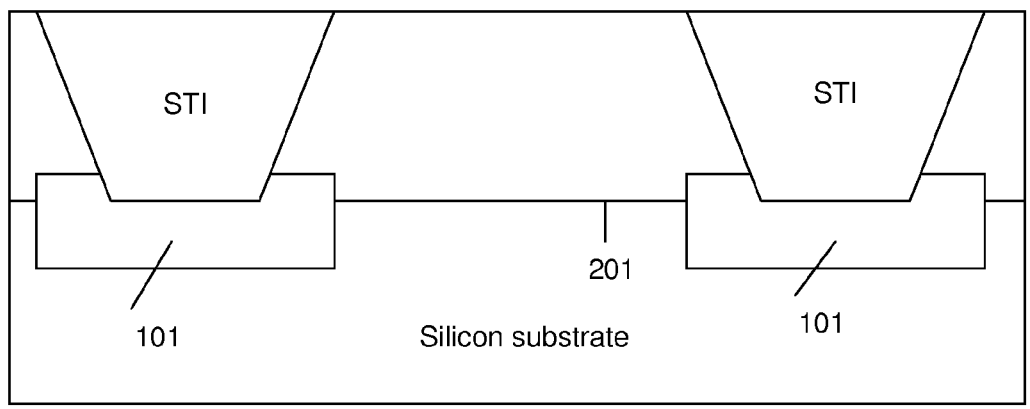

Process step 2 as in FIG. 2B; after STI and PBL formation, collector region 201 is formed by full p well implant, or formed by only anti punch-through and threshold implant of p well implants. Thermal anneal process is followed, link will be established by lateral and vertical diffusion of low resistance zone 101 to active region. This is beneficial for base link resistance reduction.

Figure 2C:
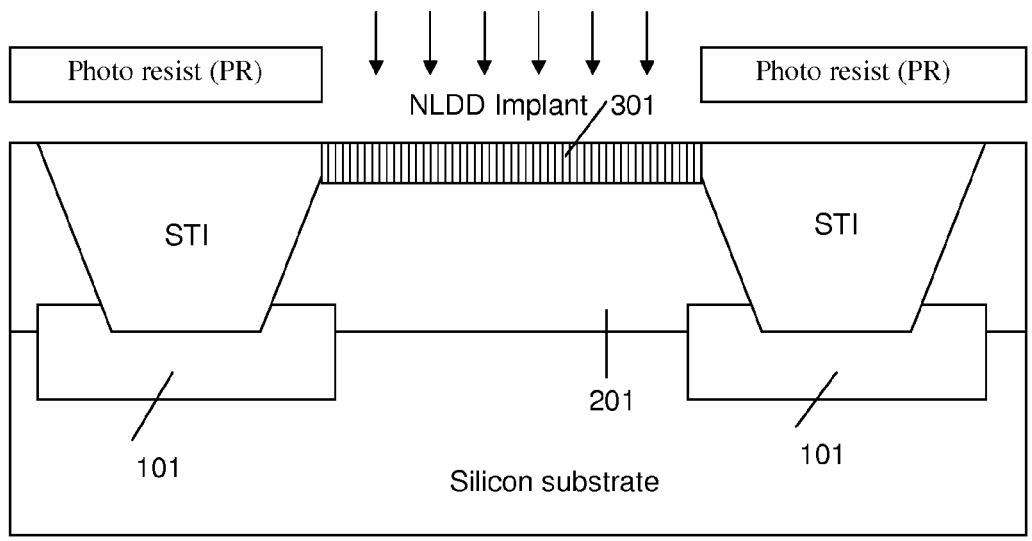

Process step 3 as in FIG. 2C; base 301 is formed by NLDD implant to P type collector 201. The implant area is defined by photo layer.

Figure 2D:
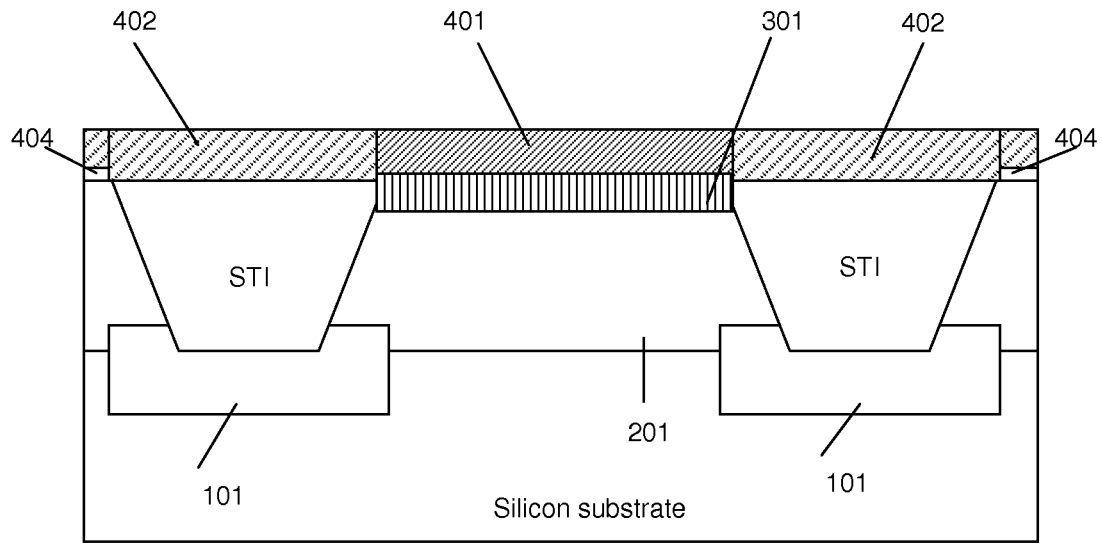

Process step 4 as in FIG. 2D; silicon oxide ($SiO_2$) thin film is deposited, a polysilicon thin film may also be deposited, collector area 201 is opened by photo and etch. A silicon, or SiGe, or SiGeC epitaxy layer is grown after pre-clean to silicon surface. A single crystal layer 401 is formed in active surface while a polysilicon is grown in other region.

Figure 2E:
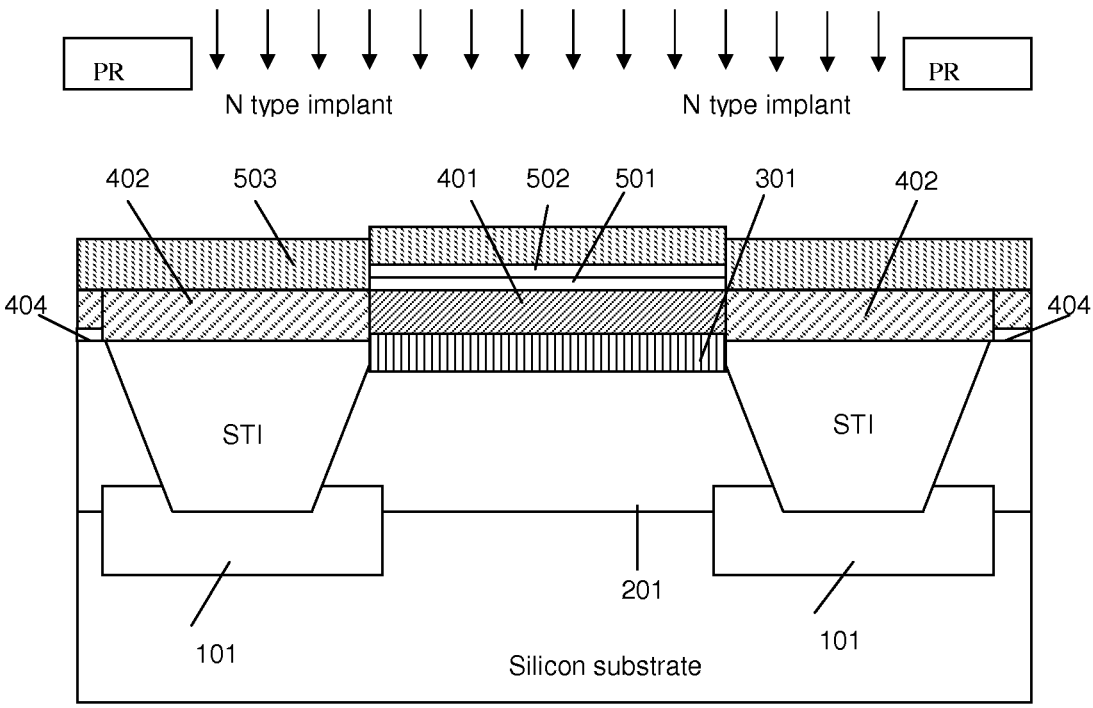

Process step 5 as in FIG. 2E; $SiO_2$ 501 of 10~50 nanometer (nm) and silicon nitride ($Si_3N_4$) 502 of 10~50 nm are deposited, then they go through litho and etch. Only specific location as indicated in FIG. 2E have $SiO_2$ and $Si_3N_4$ left, an isolation of emitter 401 to subsequent deposited polysilicon 503 of thickness 150~350 nm can be achieved. The covered area by $SiO_2$ 501 and $Si_3N_4$ 502 can be the same size as active area, or slightly bigger than active. The polysilicon can be in-situ doped, the dopant should be phosphorous, or arsenic. The polysilicon can also be un-doped, and doped later by N-type implant. FIG. 2E shows an implant approach. This N type implant can be either separate implant to polysilicon, or together with NMOS source/drain, or both. The doped zone can be defined by litho. For vertical PNP only process, litho is not necessary, a global implant can be used.

Figure 2F:
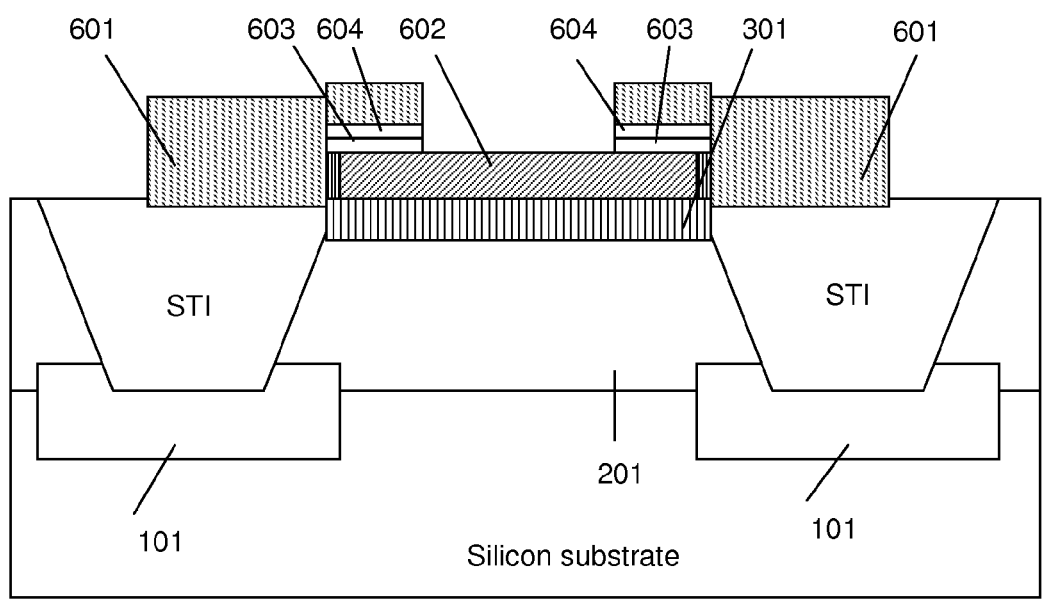

Process step 6 as in FIG. 2F; polysilicon, dielectric $Si_3N_4$ 502 and $SiO_2$ 501 are etched away and emitter 602 of PNP is opened, After etch only part of dielectric remains, labeled as 603 for $Si_3N_4$ and 604 for $SiO_2$. It is used as isolation between polysilicon. Part of polysilicon used for link base is retained after etch. Heavily doped P type ion implant is carried after etch before resist strip. The impurity can be Boron, Boron Fluoride, or Indium. This implant can use the same process as extrinsic base implant of NPN bipolar transistor. Thermal anneal is carried out afterwards. This step is very critical for base link. From this thermal anneal step, the P type epitaxy polysilicon 402 should completely revert to N type through fast diffuse of dopant in polysilicon. N type polysilicon 601 and N type base 301 is linked then. Emitter and base PN junction is also pushed vertically to LDD region due to lower dopant concentration of LDD compared to that of emitter. Emitter 602 is finally formed by this thermal anneal also.

It will be apparent to those skilled in the art that various modifications and variations can be made in the fabrication method for a parasitic vertical PNP bipolar transistor without departing from the spirit or scope of the invention. Thus, it is intended that the present invention covers the modifications and variations of this invention provided they come within the scope of the appended claims and their equivalents.

The invention claimed is:

1. A parasitic vertical PNP device in a BiCMOS process with shallow trench isolation (STI) on bulk silicon substrate comprises:
   a collector being formed by implanting p-type impurity in an active area;
   pseudo buried layers at the bottom of the STI at both sides of the active area by implanting heavy dose of the p-type impurity into the bulk silicon substrate, wherein the pseudo buried layers is directly connected with the bulk silicon substrate, and forms a PN junction;
   deep contacts wherein the deep contracts are through field oxide to connect to the pseudo buried layers and to pick up the collector;
   a base being formed by ion implanting a n-type impurity layer wherein the base sits on top of the collector;
   an emitter which is a single crystal p-type epitaxy layer wherein the emitter lies above the base and is connected directly by a metal contact; and
   a portion of the p-type epitaxy layer on top of the base is converted into n-type and serves as a connection path of the base.

2. The parasitic vertical PNP device in a BiCMOS process as recited in claim 1 comprises, p type pseudo buried layer of connecting the collector with the ion implant dosage range 1e14~1e16 $cm^{-2}$ and energy below 45 keV.

* * * * *